(12) United States Patent
Tsai et al.

(10) Patent No.: US 8,194,480 B2
(45) Date of Patent: Jun. 5, 2012

(54) METHOD FOR INITIALIZING MEMORY DEVICE

(75) Inventors: Cheng-Che Tsai, Tainan County (TW); Pu-Jen Cheng, Tainan County (TW)

(73) Assignee: Himax Technologies Limited, Tainan (TW)

( * ) Notice: Subject to any disclaimer, the term of this patent is extended or adjusted under 35 U.S.C. 154(b) by 322 days.

(21) Appl. No.: 12/622,063

(22) Filed: Nov. 19, 2009

(65) Prior Publication Data
US 2011/0116331 A1    May 19, 2011

(51) Int. Cl.
*G11C 7/00* (2006.01)
*G11C 8/18* (2006.01)

(52) U.S. Cl. ................ 365/198; 365/233.1; 365/221

(58) Field of Classification Search .......... 365/198, 365/221, 233.1
See application file for complete search history.

(56) References Cited

U.S. PATENT DOCUMENTS 5,513,334 A * 4/1996 Alexander .............. 711/103
7,554,843 B1 * 6/2009 Blyth et al. .............. 365/185.03

* cited by examiner

*Primary Examiner* — Hoai V Ho
*Assistant Examiner* — Tri Hoang
(74) *Attorney, Agent, or Firm* — J.C. Patents

(57) ABSTRACT

A method for initializing a memory device is provided. The method includes a step for transmitting at least N+1 clock cycles to the memory device, wherein the N is an amount of bits of output serial data of the memory device. During a clock cycle of the at least N+1 clock cycles, a first start/stop signal is transmitted to the memory device. During another clock cycle of the at least N+1 clock cycles, a second start/stop signal is transmitted to the memory device.

11 Claims, 2 Drawing Sheets

METHOD FOR INITIALIZING MEMORY DEVICE

BACKGROUND OF THE INVENTION

1. Field of the Invention

The present invention relates to a two-line transmission interface. More particularly, the present invention relates to a method for initializing a memory device having a two-line transmission interface.

2. Description of Related Art

Generally, in a two-line transmission interface, for example, an inter-integrated circuit bus (I2C BUS), two lines of a serial clock (SCL) line and a serial data (SDA) line are used to transmit data. Taking a liquid crystal display (LCD) as an example, a timing controller thereof can use the I2C BUS to access an electrically erasable programmable read-only memory (EEPROM). The timing controller provides the SCL to the EEPROM to synchronize a mutual communication timing. Data transmission between the timing controller and the EEPROM is only depended on one bus line of SDA. The timing controller has to access related set data in the EEPROM through the I2C BUS.

FIG. 1 is a diagram illustrating a read operation performed to the EEPROM by the timing controller through the I2C BUS. The timing controller provides the SCL to the EEPROM. The timing controller transmits a read request to the EEPROM through the SDA line according to SCL timing. After the read request is received, the EEPROM transmits corresponding data to the timing controller through the SDA line according to the SCL timing provided by the timing controller.

Referring to FIG. 1, the timing controller sends a start signal S to the EEPROM through the SDA line, so that the EEPROM enters a state for receiving a control byte. Then, the timing controller immediately sends the control byte containing an identification code and a read/write command to the EEPROM. Assuming an identification code of the EEPROM is 001, and the timing controller is about to write a target address in the EEPROM, the timing controller may transmit a control byte with a content of "1010 001 0" to the EEPROM, wherein the last bit "0" represents a "write" command. After the operation of receiving the control byte is completed through 8 clock cycles, the EEPROM immediately sends an acknowledgement signal ACK (i.e. logic 0) to the timing controller through the SDA line. After the timing controller receives the acknowledgement signal ACK, the timing controller writes the data (i.e. the aforementioned target address) into the EEPROM through the SDA line. After the operation of receiving the target address is completed through 8 clock cycles, the EEPROM immediately sends the acknowledgement signal ACK to the timing controller. Now, addressing operation of the EEPROM is completed.

The timing controller further transmits the start signal S to the EEPROM through the SDA, so that the EEPROM again enters the state for receiving the control byte. Then, the timing controller immediately sends the control byte to the EEPROM. Since a read operation is performed to the EEPROM, the timing controller transmits the control byte with a content of "1010 001 1" to the EEPROM, wherein the last bit "1" represents a "read" command. After the operation of receiving the control byte is completed through 8 clock cycles, the EEPROM immediately sends the acknowledgement signal ACK to the timing controller through the SDA line. Then, corresponding data of the above addressing operation is transmitted back to the timing controller through 8 clock cycles. After the data is transmitted back, the EEPROM immediately sends a signal NO_ACK to the timing controller. Finally, the timing controller sends a stop signal P to the EEPROM through the SDA line to trigger the EEPROM entering an initialization state (i.e. a state waiting for receiving a command of a main device). Now, the timing controller completes the read operation of the EEPROM.

However, in the above read operation, the read operation of the EEPROM performed by the timing controller can be interrupted by a glitch of a reset signal or other factors, and when the timing controller re-performs the read operation to the EEPROM, since the EEPROM is probably stopped at an undominative state due to the former interruption of the read operation, the timing controller cannot re-perform the read operation. Therefore, before the timing controller performs the read operation to the EEPROM, the EEPROM has to be initialized.

SUMMARY OF THE INVENTION

The present invention is directed to a method for initializing a memory device, by which whatever an operation state the memory device has, the memory device can be recovered to an initialization state.

The present invention provides a method for initializing a memory device. The method includes following steps. First, at least N+1 clock cycles are transmitted to the memory device, wherein N is an amount of bits of output serial data of the memory device. Next, during a clock cycle of the at least N+1 clock cycles, a first start/stop signal is transmitted to the memory device. Finally, during another clock cycle of the at least N+1 clock cycles, a second start/stop signal is transmitted to the memory device.

In an embodiment of the present invention, besides the first start/stop signal and the second start/stop signal, none signal is transmitted to the memory device during the at least N+1 clock cycles.

In an embodiment of the present invention, the first start/stop signal and the second start/stop signal can be start signals or stop signals.

In an embodiment of the present invention, the first start/stop signal is transmitted during a first clock cycle of the at least N+1 clock cycles.

In an embodiment of the present invention, a time interval between the first start/stop signal and the second start/stop signal is at least one clock cycle.

In an embodiment of the present invention, besides the first start/stop signal and the second start/stop signal, at least one third start/stop signal is transmitted to the memory device during the at least N+1 clock cycles.

In the present invention, two or more than two start/stop signals are transmitted to the memory device during the N+1 clock cycles. Therefore, during a non-output period of the memory device, the first start/stop signal triggers the memory device entering an initialization state. If the first start/stop signal is conflicted to the acknowledgement signal transmitted back by the memory device, the second start/stop signal can be assuredly transmitted to the memory device to trigger the memory device entering the initialization state. During an output period of the memory device, though the start/stop signals transmitted to the memory device can be conflicted to the data output from the memory device, by providing at least N+1 clock cycles to the memory device, the memory device is impelled to end the output period/state and enter the initialization state.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
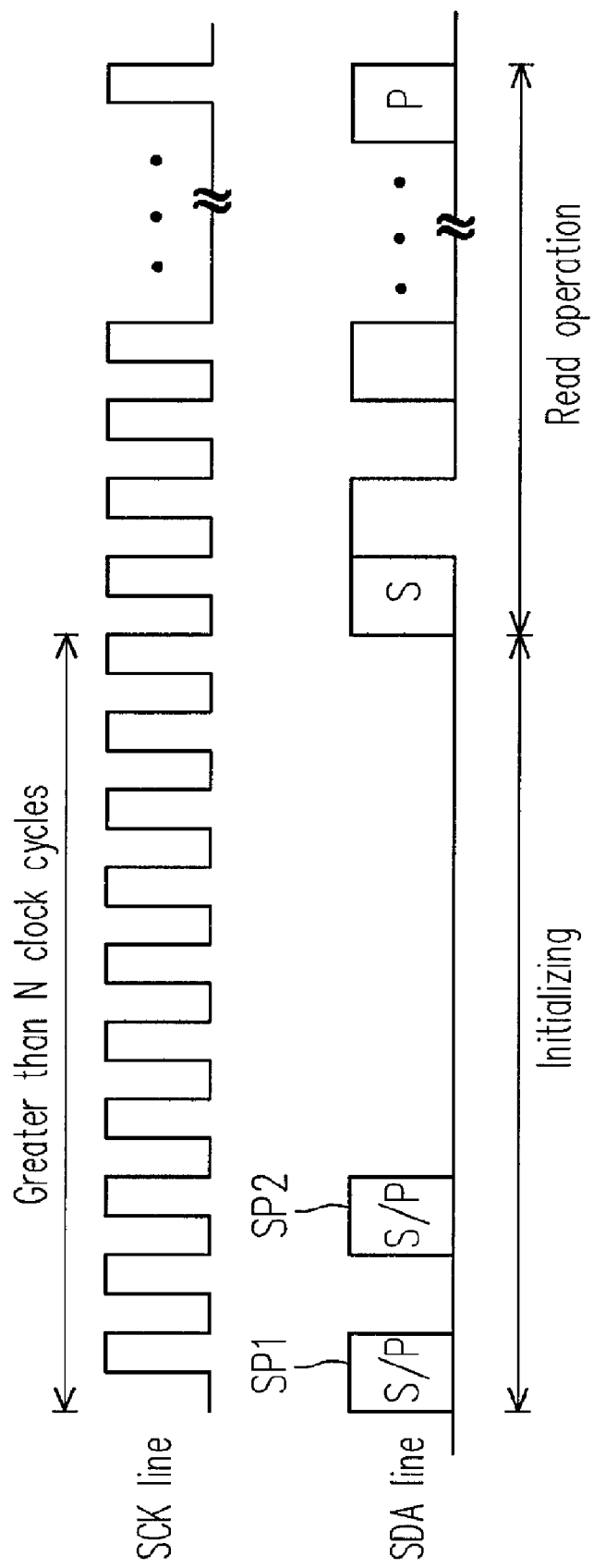
FIG. 2 is a diagram illustrating a method for initializing a memory device according to an embodiment of the present invention.

FIG. 2 is a diagram illustrating a method for initializing a memory device according to an embodiment of the present invention. A main device (for example, a timing controller) accesses the memory device (for example, an electrically erasable programmable read-only memory (EEPROM)) through a two-line transmission interface. The two-line transmission interface (for example, an inter-integrated circuit bus (I2C BUS)) contains two lines of a serial clock (SCL) line and a serial data (SDA) line. The main device provides clock cycles to the memory device through the SCL line, so as to synchronize a mutual communication timing. According to the timing of the SCL line, the main device transmits start/stop signals, control bytes, and address data, etc. to the memory device through the SDA line. The memory device transmits acknowledgement signals, and output serial data, etc to the main device through the SDA line according to the timing of the SCL line.

Figure 1:
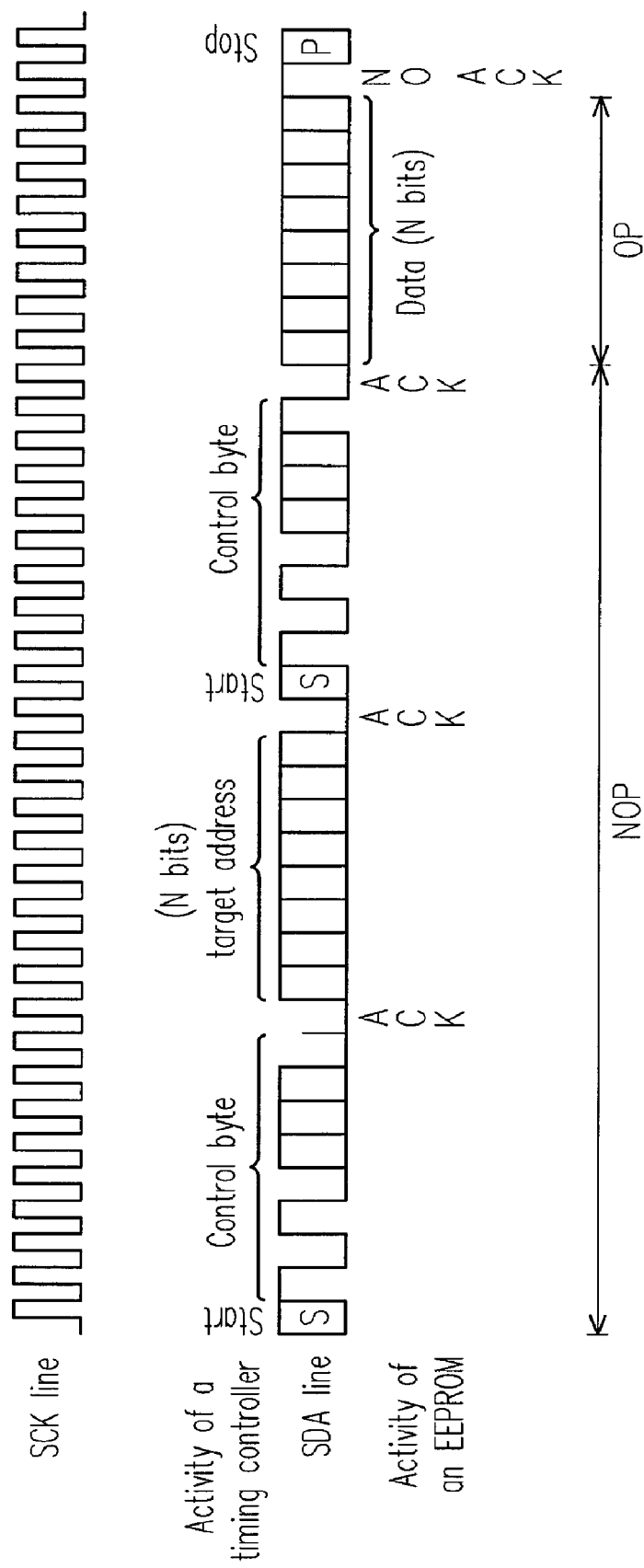
FIG. 1 is a diagram illustrating a read operation performed to an EEPROM by a timing controller through an I2C BUS.

When the main device is about to initialize the memory device, the main device provides at least N+1 clock cycles to the memory device through the SCL line, wherein N is an amount of bits of the output serial data of the memory device. Taking a read operation of FIG. 1 as an example, the amount of bits of the output serial data of the memory device is 8, so that N is set to 8. In the present embodiment, the main device provides at least 9 clock cycles to the memory device through the SCL line.

During the initializing period (i.e. the N+1 clock cycles), the main device selects two clock cycles from the N+1 clock cycles according to the timing of the SCL line, and during the two clock cycles, the main device transmits a first start/stop signal SP1 and a second start/stop signal SP2 to the memory device through the SDA line. The start/stop signals SP1 and SP2 can all be start signals S or stop signals P.

Alternatively, the first start/stop signal SP1 is the start signal S, and the second start/stop signal SP2 is the stop signal P.

In the present embodiment, the main device respectively transmits the start/stop signals SP1 and SP2 to the memory device during a first and a third clock cycles of the N+1 clock cycles. During the initialization period (N+1 clock cycles), besides the start/stop signals SP1 and SP2, the main device can transmit any signal (for example, a signal with logic 0 or a signal with logic 1). In the present embodiment, besides the start/stop signals SP1 and SP2, the main device does not transmit any signal to the memory device during the clock cycles.

Time points for transmitting the start/stop signals SP1 and SP2 are not limited to that shown in FIG. 2. The start/stop signals SP1 and SP2 can be transmitted to the memory device during any two clock cycles of the N+1 clock cycles. The start/stop signals SP1 and SP2 can be consecutive, i.e. there is no time interval between the two start/stop signals. Alternatively, the time interval between the start/stop signals SP1 and SP2 can be one or a plurality of clock cycles.

If the memory device is abnormally interrupted during a non-output period NOP (shown in FIG. 1), since the SDA line is controlled by the main device, the main device triggers the memory device entering the initialization state (i.e. a state waiting for receiving a command from the main device) through the first start/stop signal SP1 (for example, the stop signal P). Though during the non-output period NOP, the SDA line is controlled by the main device, the memory device still requires transmitting the acknowledgement signal ACK (shown in FIG. 1) back to the main device through the SDA line during such period. If the first start/stop signal SP1 is conflicted to the acknowledgement signal ACK transmitted back by the memory device, the second start/stop signal SP2 (for example, the stop signal P) can be assuredly transmitted to the memory device. Namely, even if the first start/stop signal SP1 is failed to trigger the initialization state of the memory device, the second start/stop signal SP2 can assuredly trigger the memory device entering the initialization state (i.e. the state waiting for receiving a command from the main device).

An amount of the start/stop signals transmitted during the initialization period (the N+1 clock cycles) can be determined by a user according to a design requirement. For example, besides the first and the second start/stop signals, at least one third start/stop signal (for example, the stop signal P, which is not illustrated) is transmitted to the memory device during the clock cycles.

If the memory device is abnormally interrupted during an output period OP (shown in FIG. 1), since the SDA line is controlled by the memory device, the start/stop signals SP1 and SP2 transmitted by the main device are all conflicted to the output of the memory device. Namely, during the output period OP, the main device cannot transmit the start/stop signals to the memory device, and therefore cannot trigger the memory device entering the initialization state during the output period OP. Therefore, the main device can impel the memory device to complete outputting N bits of data according to more than N clock cycles transmitted by the SCL line. When the memory device completes outputting the N bits of data, naturally, the memory device ends the output period/state and enters the initialization state (i.e. the state waiting for receiving a command from the main device, referring to the description of FIG. 1). Thereafter, the main device starts to normally access the memory device, for example, perform the read operation shown in FIG. 1.

In summary, when the memory device is abnormally interrupted, whatever the operation state the memory device has, after the aforementioned method for initializing the memory device is completed, the memory device can be effectively recovered to the initialization state. Therefore, after the N+1 clock cycles for the initialization are completed, the main device can normally access the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for initializing a memory device, comprising:
   transmitting at least N+1 clock cycles to the memory device if output serial data of the memory device is N bits;
   transmitting a first start/stop signal to the memory device during a clock cycle of the at least N+1 clock cycles;
   transmitting a second start/stop signal to the memory device during another clock cycle of the at least N+1 clock cycles; and
   transmitting at least one third start/stop signal to the memory device during the at least N+1 clock cycles besides the first start/stop signal and the second start/stop signal.

2. The method for initializing the memory device as claimed in claim 1, wherein besides the first start/stop signal and the second start/stop signal, no pulse signal is transmitted to the memory device during the at least N+1 clock cycles.

3. The method for initializing the memory device as claimed in claim 1, wherein the first start/stop signal and the second start/stop signal are all start signals.

4. The method for initializing the memory device as claimed in claim 1, wherein the first start/stop signal and the second start/stop signal are all stop signals.

5. The method for initializing the memory device as claimed in claim 1, wherein the first start/stop signal is a start signal, and the second start/stop signal is a stop signal.

6. The method for initializing the memory device as claimed in claim 1, wherein the first start/stop signal is transmitted during a first clock cycle of the at least N+1 clock cycles.

7. The method for initializing the memory device as claimed in claim 1, wherein a time interval between the first start/stop signal and the second start/stop signal is at least one clock cycle.

8. The method for initializing the memory device as claimed in claim 1, wherein the third start/stop signal is a stop signal.

9. The method for initializing the memory device as claimed in claim 1, wherein after the at least N+1 clock cycles are ended, the memory device is accessed.

10. The method for initializing the memory device as claimed in claim 1, wherein the memory device receives the at least N+1 clock cycles, the first start/stop signal and the second start/stop signal through a two-line transmission interface.

11. The method for initializing the memory device as claimed in claim 10, wherein the two-line transmission interface transmits data by using a serial clock (SCL) line and a serial data (SDA) line.

* * * * *